(12) United States Patent
Ranjan et al.

(10) Patent No.: US 9,111,746 B2
(45) Date of Patent: Aug. 18, 2015

(54) METHOD FOR REDUCING DAMAGE TO LOW-K GATE SPACER DURING ETCHING

(75) Inventors: Alok Ranjan, Slingerlands, NY (US); Angelique D. Raley, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/589,096

(22) Filed: Aug. 18, 2012

(65) Prior Publication Data
US 2013/0252430 A1   Sep. 26, 2013

Related U.S. Application Data

(60) Provisional application No. 61/613,985, filed on Mar. 22, 2012.

(51) Int. Cl.
*H01L 21/302* (2006.01)
*H01L 29/76* (2006.01)
(Continued)

(52) U.S. Cl.
CPC ........ *H01L 21/0206* (2013.01); *H01L 21/0212* (2013.01); *H01L 21/02126* (2013.01); *H01L 21/02274* (2013.01); *H01L 21/31116* (2013.01); *H01L 21/31138* (2013.01); *H01L 21/31144* (2013.01); *H01L 29/4983* (2013.01); *H01L 29/6653* (2013.01); *H01J 37/32082* (2013.01);
(Continued)

(58) Field of Classification Search
CPC ............... H01L 21/02112; H01L 21/02126; H01L 21/02271; H01L 21/02274; H01L 21/31116; H01L 21/31144; H01L 29/66795; H01L 29/6656
USPC ......... 438/187, 218, 219, 427, 740, 598, 305, 438/698, 696, 197, 689, 694, 706, 710; 257/E21.252, E21.249, 215, 255, 347, 257/331, 288, 401, 350; 216/46, 58, 67
See application file for complete search history.

(56) References Cited

U.S. PATENT DOCUMENTS 6,207,544 B1   3/2001   Nguyen et al.
6,242,334 B1   6/2001   Huang et al.
(Continued)

OTHER PUBLICATIONS

Martin Kogelschatz, Gilles Cunge, and Nader Sadeghi, "Analysis of the chemical composition and deposition mechanism of the SiOxCly layer on the plasma chamber walls during silicon gate etching", J. Vac. Sci. Technol. A 22, 624 (2004) (Abstract only).
(Continued)

*Primary Examiner* — Nadine Norton
*Assistant Examiner* — Christopher Remavege

(57) ABSTRACT

A method for performing a spacer etch process is described. The method includes providing a gate structure on a substrate having a low-k spacer material conformally applied over the gate structure, and performing a spacer etch process sequence to partially remove the spacer material from the gate structure and the substrate, while retaining a sidewall spacer positioned along a sidewall of the gate structure. The spacer etch process sequence may include depositing a spacer protection layer on an exposed surface of said spacer material, and performing one or more etching processes to selectively and anisotropically remove the spacer protection layer and the spacer material to leave behind the sidewall spacer on the sidewall of the gate structure, wherein, while being partly or fully consumed by the one or more etching processes, the spacer protection layer exhibits a reduced variation in composition and/or dielectric constant.

17 Claims, 13 Drawing Sheets

(51) Int. Cl.
*H01L 21/02* (2006.01)
*H01L 21/311* (2006.01)
*H01L 29/49* (2006.01)
*H01L 29/66* (2006.01)
*H01L 29/51* (2006.01)
*H01J 37/32* (2006.01)

(52) U.S. Cl.
CPC ......... *H01J 2237/334* (2013.01); *H01L 29/517* (2013.01); *H01L 29/518* (2013.01); *H01L 29/6656* (2013.01)

(56) References Cited

U.S. PATENT DOCUMENTS

| | | | |
|---|---|---|---|
| 6,261,913 B1 | 7/2001 | Akram et al. | |
| 6,277,700 B1 | 8/2001 | Yu et al. | |
| 6,323,519 B1* | 11/2001 | Gardner et al. | 257/336 |
| 6,756,313 B2 | 6/2004 | Choi et al. | |
| 6,815,350 B2 | 11/2004 | Kim et al. | |
| 6,962,862 B2* | 11/2005 | Kumamoto | 438/595 |
| 7,022,596 B2* | 4/2006 | Zhong et al. | 438/595 |
| 7,192,881 B2 | 3/2007 | Kammler et al. | |
| 7,342,290 B2 | 3/2008 | Burnham et al. | |
| 7,763,542 B2 | 7/2010 | Kim et al. | |
| 8,614,149 B2* | 12/2013 | Lee et al. | 438/702 |
| 2003/0051665 A1* | 3/2003 | Zhao et al. | 118/723 E |
| 2004/0259343 A1* | 12/2004 | Buller et al. | 438/595 |
| 2005/0146059 A1* | 7/2005 | Zhong et al. | 257/900 |
| 2008/0087957 A1* | 4/2008 | Katsumata et al. | 257/336 |
| 2009/0146296 A1 | 6/2009 | Ye et al. | |
| 2009/0263972 A1* | 10/2009 | Balseanu et al. | 438/696 |
| 2010/0062577 A1* | 3/2010 | Liao et al. | 438/301 |
| 2010/0062592 A1* | 3/2010 | Clark | 438/591 |
| 2010/0173496 A1* | 7/2010 | Zhong et al. | 438/696 |
| 2010/0187545 A1* | 7/2010 | Khan et al. | 257/79 |
| 2011/0031538 A1* | 2/2011 | Hsieh et al. | 257/288 |
| 2011/0092030 A1* | 4/2011 | Or-Bach et al. | 438/129 |
| 2011/0241085 A1 | 10/2011 | O'Meara et al. | |
| 2011/0241128 A1 | 10/2011 | O'Meara et al. | |
| 2011/0287577 A1 | 11/2011 | Stewart et al. | |
| 2012/0025323 A1* | 2/2012 | Teo et al. | 257/384 |

OTHER PUBLICATIONS

Ko, C.H. et al., "A novel CVD-SiBCN Low-K spacer technology for high-speed applications," 2008 Symp. on VLSI Tech, pp. 108-109, Jun. 2008 (Abstract only).

Kuhn, K.J., Liu, M.Y., and Kennel, H. "Technology Options for 22nm and Beyond", International Workshop on Junction Technology, Keynote Speaker, May 2010.

International patent Application serial No. PCT/US2013/033319, "International Preliminary Report on Patentability," mailed Sep. 23, 2014, International filing date Mar. 21, 2013.

Taiwan Patent Application No. 102110048, "Notification of Examination Opinion," dated Jan. 28, 2015, application filing date Mar. 21, 2013.

\* cited by examiner

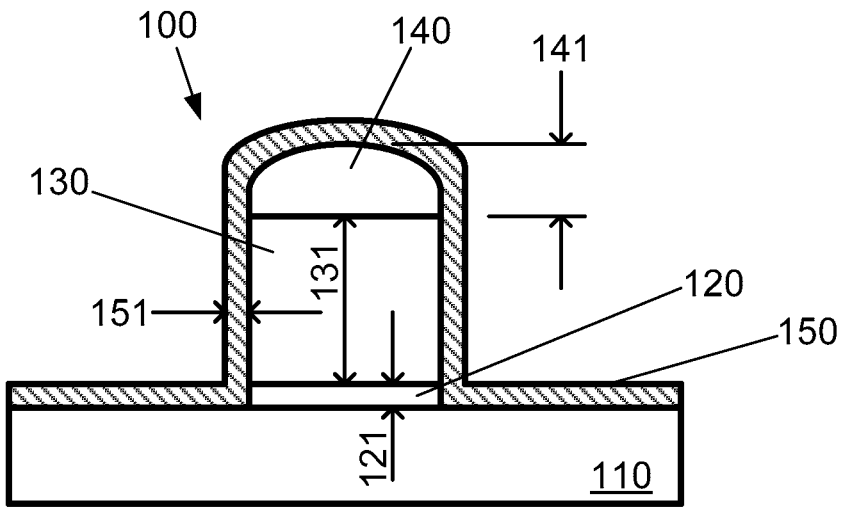
FIG. 1A            PRIOR ART
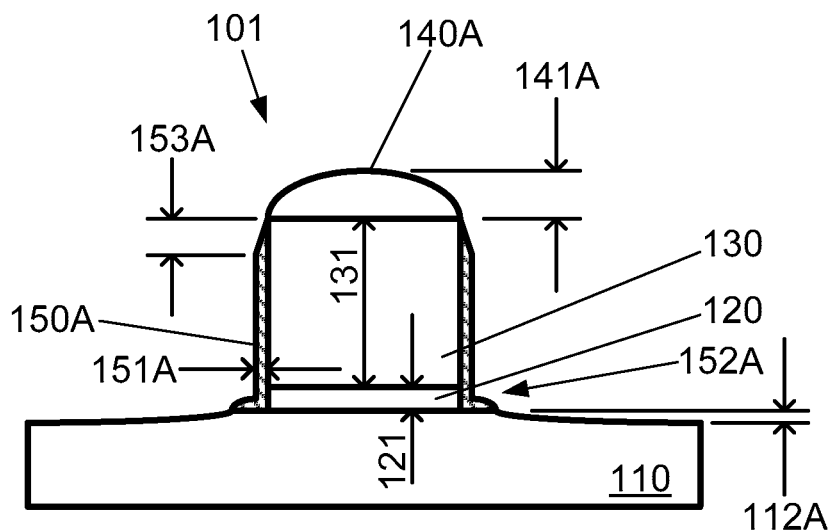
FIG. 1B            PRIOR ART

METHOD FOR REDUCING DAMAGE TO LOW-K GATE SPACER DURING ETCHING

CROSS-REFERENCE TO RELATED APPLICATIONS

Pursuant to 37 CFR §1.78(a)(4), this application claims the benefit of and priority to U.S. Provisional Application Ser. No. 61/613,985, filed on Mar. 22, 2012, the entire content of which is herein incorporated by reference.

FIELD OF INVENTION

The invention relates to a method of preparing a sidewall spacer for a structure on a substrate.

BACKGROUND OF THE INVENTION

In semiconductor manufacturing and during the fabrication of a transistor gate, a spacer material is conformally applied to the transistor gate, and then partially removed to form a sidewall spacer on a sidewall of the transistor gate. During the partial removal of the spacer material from the transistor gate and the substrate, the success of a spacer etch process is determined by measuring, among other things, the following performance metrics: (a) the size of the sidewall spacer footing, (b) the depth of the substrate recess, (c) the amount of sidewall spacer critical dimension (CD) slimming, and (d) the depth of the spacer top recess. Conventional spacer etch processes produce unacceptable results in at least one of these performance metrics.

Furthermore, as the dimensions of the transistor gate continue to shrink, the fringe capacitance between the gate and contact, as well as between the gate and facet of the source/drain (S/D), has increased. To counter this increase in fringe capacitance, low-k dielectric materials have been implemented as the spacer material. Therefore, the success of the spacer etch process is also determined by measuring the effect of the spacer etch process on the resultant dielectric constant of the low-k dielectric material used for the spacer material. Conventional spacer etch processes deplete the spacer material of various constituents, which in turn, causes an undesirable increase in the dielectric constant.

SUMMARY OF THE INVENTION

Embodiments of the invention relate to a method of preparing a sidewall spacer and, in particular, to a method of preparing a sidewall spacer for a structure, such as a gate structure, on a substrate. Following preparation of the sidewall spacer using a spacer etch process sequence, the spacer protection layer exhibits a reduced variation in composition and/or dielectric constant as a result of the spacer etch process sequence.

According to one embodiment, a method for performing a spacer etch process is described. The method includes providing a gate structure on a substrate having a low-k spacer material conformally applied over the gate structure, wherein the low-k spacer material contains Si, N, C, and B, and performing a spacer etch process sequence to partially remove the spacer material from the gate structure and the substrate, while retaining a sidewall spacer positioned along a sidewall of the gate structure. The spacer etch process sequence may include depositing a spacer protection layer on an exposed surface of said spacer material, and performing one or more etching processes to selectively and anisotropically remove the spacer protection layer and the spacer material to leave behind the sidewall spacer on the sidewall of the gate structure, wherein, while being partly or fully consumed by the one or more etching processes, the spacer protection layer limits exposure of the sidewall spacer to one or more chemical constituents in the one or more etching processes and reduces depletion of B or C in the sidewall spacer.

According to another embodiment, a method for performing a spacer etch process is described. The method includes providing a gate structure on a substrate having a low-k spacer material conformally applied over the gate structure, wherein a dielectric constant of the low-k spacer material as deposited is characterized by an initial value, and performing a spacer etch process sequence to partially remove the spacer material from the gate structure and the substrate, while retaining a sidewall spacer positioned along a sidewall of the gate structure. The spacer etch process sequence may include depositing a spacer protection layer on an exposed surface of said spacer material, and performing one or more etching processes to selectively and anisotropically remove the spacer protection layer and the spacer material to leave behind the sidewall spacer on the sidewall of the gate structure, wherein, while being partly or fully consumed by the one or more etching processes, the spacer protection layer limits exposure of the sidewall spacer to one or more chemical constituents in the one or more etching processes and reduces depletion of B or C in the sidewall spacer, wherein the dielectric constant of the low-k spacer material is characterized by a final value immediately following the performing one or more etching processes, and wherein a difference between the final value and the initial value is less than or equal to 5% of the initial value.

BRIEF DESCRIPTION OF THE DRAWINGS

In the accompanying drawings:

FIGS. 1A through 1C illustrate a schematic representation of the preparation of a sidewall spacer for a gate structure on a substrate;

FIGS. 2A through 2D illustrate a schematic representation of a method for performing a spacer etch process according to an embodiment;

DETAILED DESCRIPTION OF SEVERAL EMBODIMENTS

Figure 1C:
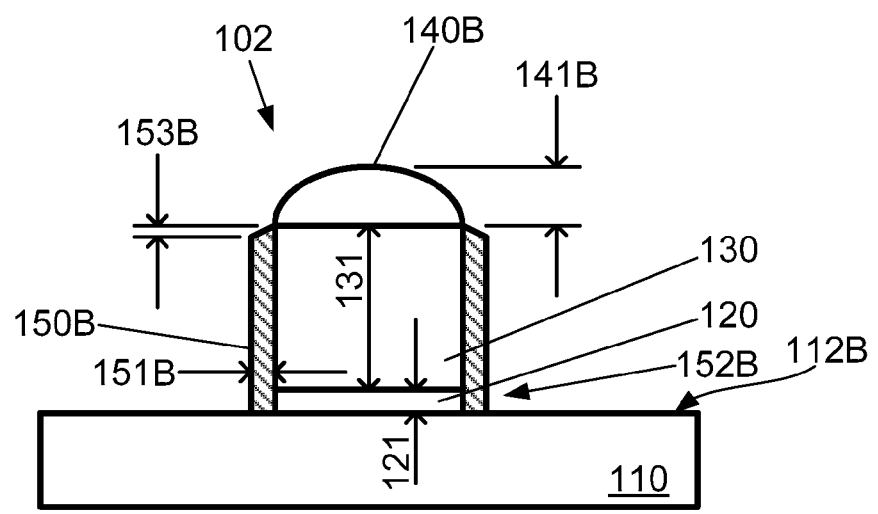

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As noted above in semiconductor manufacturing, when fabricating a transistor gate, a spacer material is conformally applied to the transistor gate, and then partially removed to form a sidewall spacer on a sidewall of the transistor gate. For example, FIG. 1A provides a pictorial illustration of a gate structure 100 formed on substrate 110, wherein the gate structure 100 includes a gate dielectric 120, a gate electrode 130, and a gate capping layer 140. Therein, the gate dielectric 120 may be characterized by an initial gate dielectric thickness 121 (e.g., about 10-40 nm (nanometers)), and the gate electrode 130 may be characterized by an initial gate electrode thickness 131 (e.g., about 30-100 nm). Further, the gate capping layer 140 may be characterized by an initial gate capping layer thickness 141 (e.g., about 10-20 nm).

A spacer material layer 150, characterized by an initial spacer material layer critical dimension (CD) 151, is subsequently formed over the gate structure 100. The spacer material layer 150 may be applied via a vapor deposition process to conform to the topography of the gate structure 100, as illustrated in FIG. 1A. For example, the spacer material layer 150 may be deposited using a chemical vapor deposition (CVD) process, a plasma-enhanced CVD (PECVD) process, an atomic layer deposition (ALD) process, a plasma-enhanced ALD (PEALD) process, a physical vapor deposition (PVD) process, a sputtering process, etc. The initial spacer material layer CD 151 may range from about 2 nm (nanometers) to about 20 nm, or preferably from about 5 nm to about 15 nm, or more preferably from about 8 nm to about 12 nm (e.g., about 9-10 nm).

During the partial removal of the spacer material layer 150 from the gate structure 100 and the substrate 110 to create a sidewall spacer (150A, 150B), the spacer etch process is evaluated by measuring, among other things, the following performance metrics: (a) the amount of CD reduction or slimming of the spacer material layer 150 along the sidewall of the gate structure 100, (b) the existence and/or size of a sidewall spacer footing, (c) the amount of substrate recess exhibited in an exposed surface of the substrate, (d) the amount of spacer recess exhibited in the spacer material layer 150 proximate the top of the gate structure 100, (e) the amount of capping material consumed from the top surface of the gate capping layer 140, and (f) the effect of the spacer etch process on the resultant dielectric constant of the low-k dielectric material used for the spacer material.

As illustrated in FIG. 1B, conventional spacer etch processes produce unacceptable results in at least one of these performance metrics. For example, following a conventional spacer etch process, a gate structure 101 is produced having a sidewall spacer 150A characterized by a final spacer material layer CD 151A. The difference between the final spacer material CD 151A and the initial spacer material CD 151 is a measure of the amount of CD reduction or slimming of the spacer material layer 150. The amount of CD reduction or slimming can be excessive, and oftentimes can exceed 20%, 30%, and even 50% the initial spacer material CD 151.

Additionally, for example, gate structure 101 may exhibit a sidewall spacer footing 152A. Furthermore, for example, gate structure 101 may exhibit any one of the following: (i) a substrate recess formed in an exposed surface of substrate 110 and characterized by a substrate recess depth 112A that may exceed 1 nm, 2 nm, and even 5 nm; (ii) a spacer recess in the spacer material layer 150 proximate the top of the gate structure 101 and characterized by a spacer recess depth 153A that may exceed 1 nm, 2 nm, and even 5 nm; and (iii) an amount of capping material consumed from the top surface of the gate capping layer 140 that produces a final gate capping layer 140A and characterized by the difference between a final gate capping layer thickness 141A and the initial gate capping layer thickness 141 that may exceed 5 nm.

Furthermore, for example, the sidewall spacer 150A may exhibit a variation in composition and/or an increase in dielectric constant that may be attributable to interaction with the process chemistry of the conventional spacer etch process. As described above, the fringe capacitance between the gate and contact, as well as between the gate and facet of the source/drain (S/D), increases with the decreasing size of the gate structure 101. To counter this increase in fringe capacitance, low-k dielectric materials have been implemented as the spacer material. However, conventional spacer etch processes deplete the spacer material of various constituents, which in turn, causes an undesirable increase in the dielectric constant.

As illustrated in FIG. 1C and further described below, a spacer etch process is presented that produces acceptable results in at least one of these performance metrics. For example, following the spacer etch process, a gate structure 102 is produced having a sidewall spacer 150B characterized by a final spacer material layer CD 151B. The difference between the final spacer material CD 151B and the initial spacer material CD 151 is a measure of the amount of CD reduction or slimming of the spacer material layer 150. The amount of CD reduction or slimming may be reduced to less than 2 nm, and desirably less than 1 nm. Alternatively, the amount of CD reduction or slimming may be reduced to less than 20%, and desirably less than 10% of the initial spacer material CD 151.

Additionally, for example, gate structure 102 may exhibit a reduced or substantially no sidewall spacer footing 152B. Furthermore, for example, gate structure 102 may exhibit any one of the following: (i) a reduced substrate recess formed in an exposed surface of substrate 110 and characterized by a substrate recess depth 112B that may be less than 3 nm, 2 nm, 1.5 nm, and even 1 nm; (ii) a spacer recess in the spacer material layer 150 proximate the top of the gate structure 102 and characterized by a spacer recess depth 153B that may be less than 5 nm, 2 nm, and even 1 nm; and (iii) an amount of capping material consumed from the top surface of the gate capping layer 140 that produces a final gate capping layer 140B characterized by the difference between a final gate capping layer thickness 141B and the initial gate capping layer thickness 141 that may be less than 5 nm.

Furthermore, for example, gate structure 102 may exhibit a reduced or substantially no increase in the dielectric constant of the sidewall spacer 150B. The gate structure 102 may exhibit a reduced or substantially no change to the composition of the sidewall spacer 150B, which will be discussed in greater detail below.

Figure 2A:
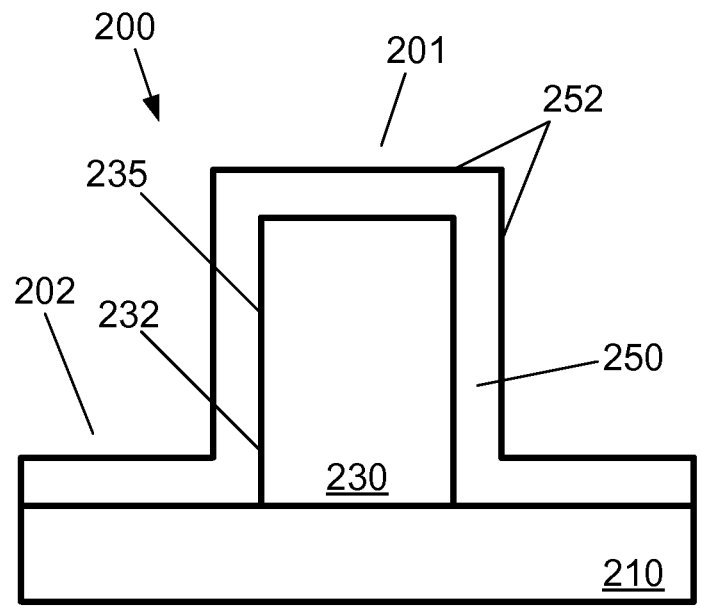

Therefore, according to various embodiments, a method for performing a spacer etch process is described. The method is pictorially illustrated in FIGS. 2A through 2D, and presented by way of a flow chart 300 in FIG. 3. As presented in FIG. 3, the flow chart 300 begins in 310 with providing a gate structure 200 on a substrate 210 having a low-k spacer material 250 conformally applied over the gate structure 200 (see FIG. 2A). While gate structure 200 is illustrative of a 2D gate structure (or planar gate structure), 3D gate structures, such as a FINFET (fin field-effect transistor), as well as other structures over which a spacer layer may be conformally applied, are also contemplated. The low-k spacer material 250 may contain Si, N, and at least one element selected from the group consisting of C and B. Additionally, the low-k spacer material 250 may contain Si, N, B, and C. For example, the low-k spacer material 250 may include SiBN, SiCN, SiBCN, or SiCBN.

Additionally, the low-k spacer material 250, as deposited, may be characterized by a dielectric constant having an initial value that is less than 7.5. For example, the low-k spacer material 250, as deposited, may be characterized by a dielectric constant having an initial value that ranges from about 4.0 to about 7.0. Alternatively, for example, the dielectric constant may have an initial value that ranges from about 5.0 to about 6.0. Alternatively yet, for example, the dielectric constant may have an initial value that ranges from about 5.0 to about 5.5.

Furthermore, the low-k spacer material 250 may be formed using a vapor deposition process, such as chemical vapor deposition (CVD), plasma-enhanced CVD (PECVD), filament-assisted CVD (FACVD), atomic layer deposition (ALD), or plasma-enhanced ALD (PEALD). Additionally, the low-k spacer material 250, conformally applied over the gate structure 200, may have a thickness less than or equal to about 20 nm, or less than or equal to about 10 nm.

The gate structure 200 comprises a patterned film stack of one or more layers 230 that may include, among other things, a gate capping layer, a gate electrode layer, a gate dielectric layer, a gate interfacial layer, etc. The gate capping layer may include an oxide, such as $SiO_2$. The gate structure 200 may further include an additional spacer material.

The gate electrode layer may include a layer of polycrystalline silicon (polysilicon, or poly-Si) and/or a metal-containing layer. The metal-containing layer may include a metal, a metal alloy, a metal nitride, or a metal oxide, and may contain, for example, titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. The metal-containing layer may replace or be integrated with a traditional poly-Si gate electrode layer.

The gate dielectric may include $SiO_2$, or a high-k (high dielectric constant) layer, and may, for example, include a lanthanum-containing layer, such as lanthanum oxide ($La_2O_3$), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k layer may incorporate metallic silicates or oxides (e.g., $Ta_2O_5$ (k~26), $TiO_2$ (k~80), $ZrO_2$ (k~25), $Al_2O_3$ (k~9)). Furthermore, for example, the high-k layer may include mixed rare earth oxides, mixed rare earth aluminates, mixed rare earth nitrides, mixed rare earth aluminum nitrides, mixed rare earth oxynitrides, or mixed rare earth aluminum oxynitrides. The gate interfacial layer may include a thin layer of silicon dioxide ($SiO_2$) disposed between the high-k layer and the substrate 210.

The substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

Figure 4:
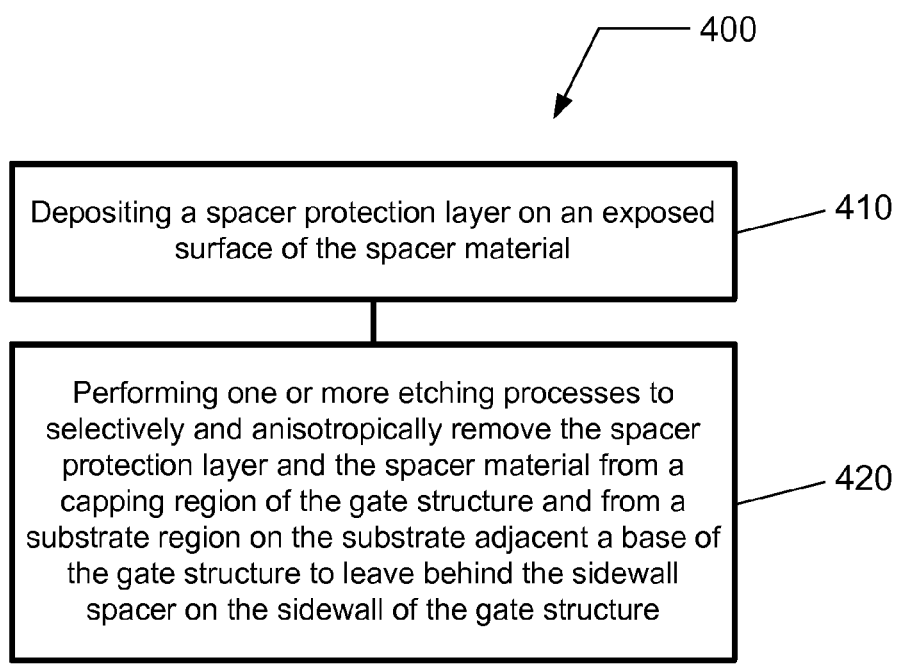
FIG. 4 provides a flow chart illustrating a method for performing a spacer etch process according to another embodiment.

In 320, a spacer etch process sequence is performed to partially remove the low-k spacer material 250 from the gate structure 200 and the substrate 210, while retaining a sidewall spacer 280 positioned along a sidewall 235 of the gate structure 200. The partial removal of the low-k spacer material 250 may include removing the low-k spacer material 250 from a capping region 201 of the gate structure 200 and a substrate region 202 on substrate 210 adjacent a base 232 of the gate structure 200. As illustrated in FIG. 4, a method for performing a spacer etch process sequence is described.

Figure 2B:
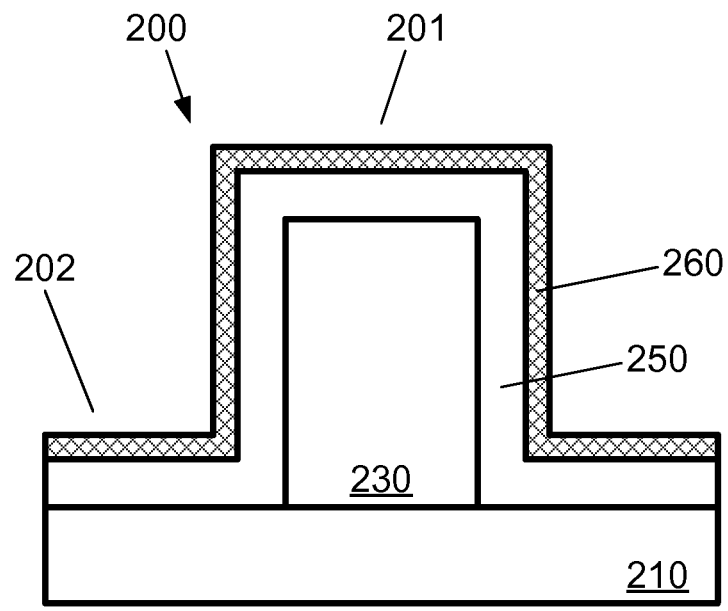
Figure 3:
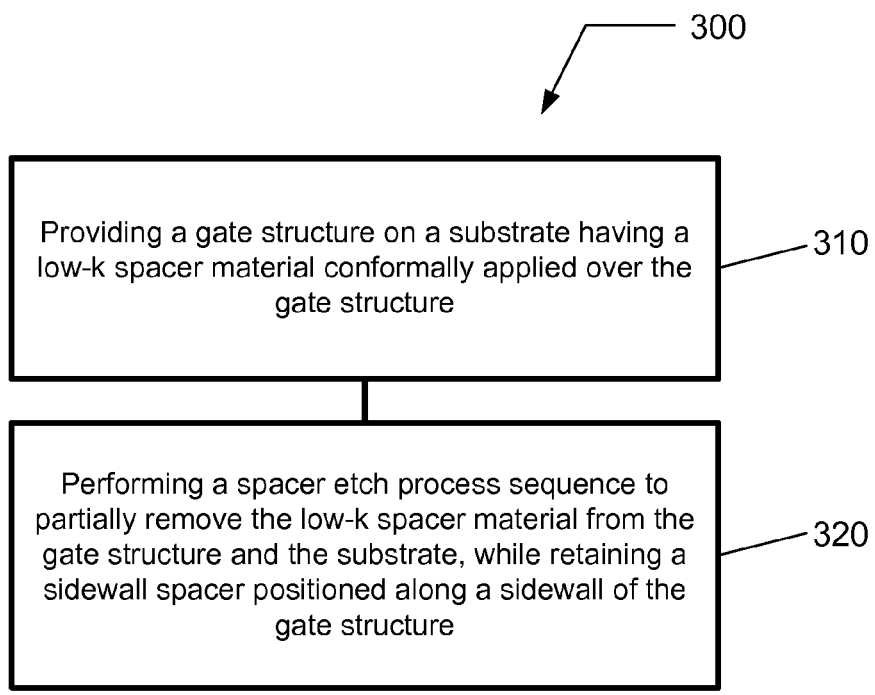
FIG. 3 provides a flow chart illustrating a method for performing a spacer etch process according to an embodiment.

The method includes a flow chart 400 beginning in 410 with depositing a spacer protection layer 260 on an exposed surface 252 of the low-k spacer material 250 (see FIG. 2B). The spacer protection layer 260 may include a SiOCl-containing layer. The SiOCl-containing layer contains Si, O, and Cl. The spacer protection layer 260 may be formed by performing a vapor deposition process in an environment containing Si, Cl, and O.

In one embodiment, the spacer protection layer 260 is formed by performing a plasma-assisted deposition process that includes generating plasma using a film forming process composition containing as incipient ingredients $SiCl_4$ and $O_2$. While the film forming process composition includes $SiCl_4$ and $O_2$, other Cl-containing and O-containing gases or vapors are contemplated. For example, the film forming process composition may include as incipient ingredients silane ($SiH_4$), a Cl-containing gas (e.g., $Cl_2$, HCl, etc.), and an oxygen-containing gas (e.g., $O_2$).

To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

The plasma-assisted deposition process may exclude application of a radio frequency (RF) bias to a substrate holder upon which substrate 210 rests. A temperature of substrate 210 may range from about 0 degrees C. to about 100 degrees C. Furthermore, when forming the spacer protection layer 260, at least one process parameter may be adjusted in the plasma-assisted deposition process to decrease a chemical permeability and/or increase an etch resistance of the spacer protection layer 260 to a subsequent etching process.

In another embodiment, the SiOCl-containing layer is formed by exposing substrate 210 to $SiCl_4$ and $H_2O$, and heating substrate 210. A temperature of substrate 210 may range from about 30 degrees C. to about 100 degrees C.

Alternatively, the spacer protection layer 260 may contain C and at least one element selected from the group consisting of F and H. The spacer protection layer 260 may be formed by performing a vapor deposition process in an environment containing C and at least one element selected from the group consisting of F and H.

In one embodiment, the spacer protection layer 260 is formed by performing a plasma-assisted deposition process that includes generating plasma using a film forming process composition containing as incipient ingredients a fluorocarbon gas expressed as $C_xH_yF_z$, where x and z are non-zero. For example, the fluorocarbon gas may include $CF_4$, $C_4F_6$, $C_4F_6$, $C_5F_8$, $CH_3F$, $CHF_3$, $CH_2F_2$, etc. For example, the film forming process composition may include as incipient ingredients $C_4F_8$ and Ar.

In another embodiment, the spacer protection layer 260 is formed by performing a plasma-assisted deposition process that includes generating plasma using a film forming process composition containing as incipient ingredients a hydrocarbon gas expressed as $C_xH_y$, where x and y are non-zero. For example, the hydrocarbon gas may include $CH_4$, $C_2H_2$, $C_2H_4$, $C_2H_6$, $C_3H_8$, etc.

To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

The plasma-assisted deposition process may exclude application of a radio frequency (RF) bias to a substrate holder upon which substrate 210 rests. A temperature of substrate 210 may range from about 0 degrees C. to about 100 degrees C. Furthermore, when forming the spacer protection layer 260, at least one process parameter may be adjusted in the plasma-assisted deposition process to decrease a chemical permeability and/or increase an etch resistance of the spacer protection layer 260 to a subsequent etching process.

Figures 2C, 2D:
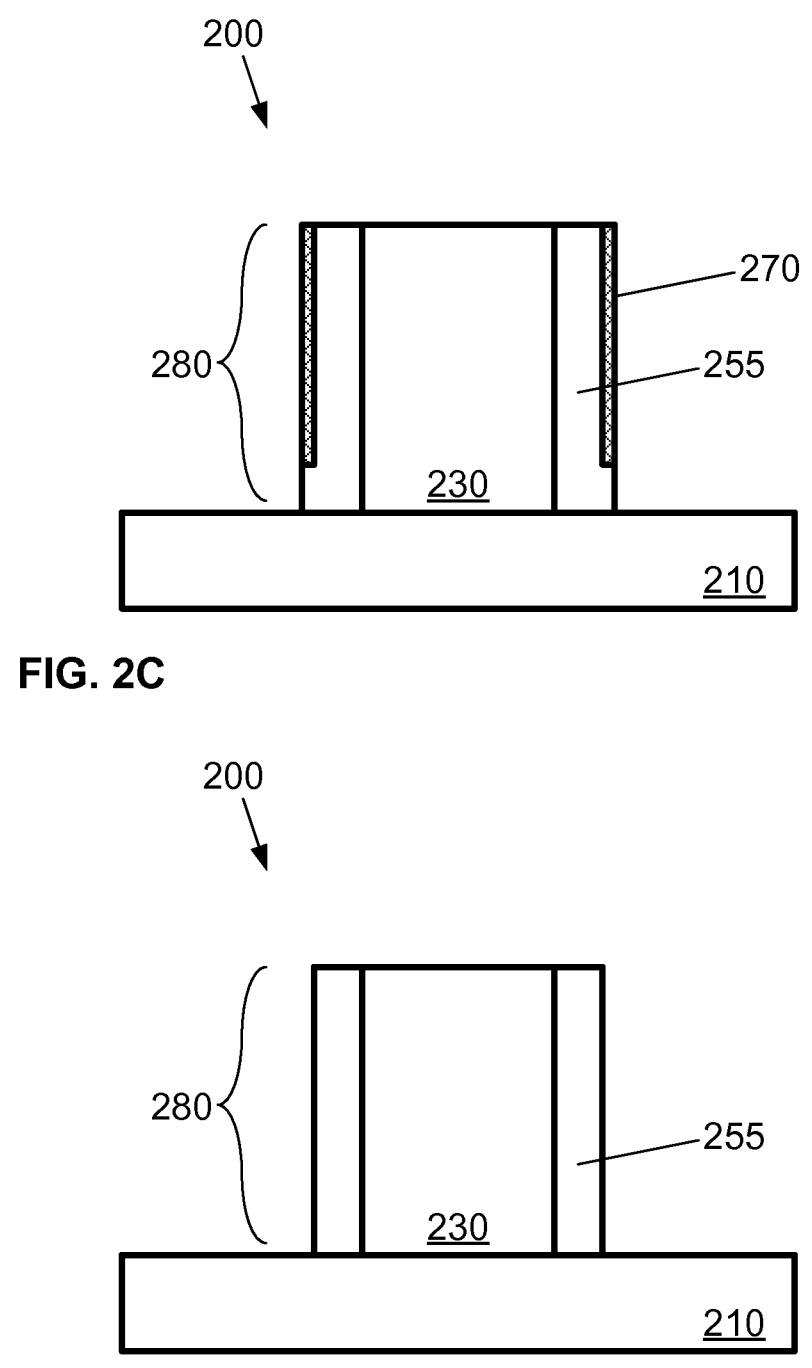

In 420, one or more etching processes are performed to selectively and anisotropically remove the spacer protection layer 260 and the low-k spacer material from the capping region 201 of the gate structure 200 and from the substrate region 202 on the substrate 210 adjacent the base 232 of the gate structure 200 to leave behind a sidewall spacer 280 on the sidewall 235 of the gate structure 200 (see FIG. 2C). The sidewall spacer 280 may include a sidewall portion 255 of the low-k spacer material 250, and possibly, a residual portion 270 of the spacer protection layer 260. While being partly or fully consumed by the one or more etching processes, the spacer protection layer 260 limits exposure of the sidewall spacer 280 to one or more chemical constituents in the one or more etching processes and reduces depletion of B or C in the sidewall spacer (relative to the conventional approach which excludes formation of the spacer protection layer 260).

Additionally, the sidewall spacer 280, as formed by the one or more etching processes, may be characterized by a dielectric constant having a final value that is substantially the same as the initial value. For example, the final value of the dielectric constant ($k_f$) for the sidewall spacer 280 may be within 5% the initial value of the dielectric constant ($k_i$) (i.e., $|k_f-k_i|/k_i \leq 0.05$). Alternatively, for example, the final value of the dielectric constant ($k_f$) for the sidewall spacer 280 may be within 2% the initial value of the dielectric constant (k) (i.e., $|k_f-k_i|/k_i \leq 0.02$). Alternatively yet, for example, the final value of the dielectric constant ($k_f$) for the sidewall spacer 280 may be within 1% the initial value of the dielectric constant (k) (i.e., $|k_f-k_i|/k_i \leq 0.01$).

The one or more etching processes may include a plasma etching process that involves forming plasma from an etching process composition and exposing the substrate 210 to the plasma. The etching process composition may contain a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may contain a hydrocarbon (i.e., $C_xH_y$, where x and y are equal to unity or greater). Alternatively, for example, the etching process composition may contain a fluorocarbon (i.e., $C_xF_y$, where x and y are equal to unity or greater). Alternatively yet, for example, the etching process composition may contain a gas having the chemical formula $C_xH_yR_z$, where R is a halogen element, x and y are equal to unity or greater, and z is equal to zero or greater.

The etching process composition may contain a fluorine-containing gas, a chlorine-containing gas, a bromine-containing gas, or a halide gas. For example, the etching process composition may contain HBr, $F_2$, $Cl_2$, $Br_2$, $BCl_3$, $NF_3$, or $SF_6$.

The etching process composition may contain a noble gas. The etching process composition may contain an oxygen-containing gas, a hydrogen-containing gas, a nitrogen-containing gas, or a carbon-containing gas, or any combination of two or more thereof. For example, the etching process composition may contain $H_2$, $O_2$, $N_2$, CO, $CO_2$, $NH_3$, NO, $N_2O$, or $NO_2$, or any combination of two or more thereof.

To form the plasma in the plasma etching process, constituents of the etching process composition should be selected that exist in a gaseous and/or vapor phase either alone or in combination with a carrier gas (e.g., a noble gas element or nitrogen) at atmospheric and/or vacuum pressures.

In one embodiment, the etching process composition may contain $CH_3F$ and Ar. In another embodiment, the etching process composition may contain $CH_3F$, $O_2$, and Ar. In yet another embodiment, the etching process composition may contain $CF_4$ and Ar.

As described above, substrate 210 is exposed to the plasma to selectively and anisotropically remove the spacer protection layer 260 and the low-k spacer material 250 from the capping region 201 of the gate structure 200 and from the substrate region 202 on the substrate 210 adjacent the base 232 of gate structure 200. The one or more etching processes may include preparation of an etch process recipe. The etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the etching process, any one of the process parameters may be varied.

In one embodiment, a plasma etching process may comprise a process parameter space that includes: a chamber pressure ranging up to about 1000 mtorr (millitorr) (e.g., up to about 200 mtorr, or ranging from about 30 to about 100 mtorr), a process gas flow rate ranging up to about 2000 sccm (standard cubic centimeters per minute) (e.g., up to about 1000 sccm, or about 1 sccm to about 200 sccm), an optional additive gas flow rate ranging up to about 2000 sccm (e.g., up to about 1000 sccm, or up to about 100 sccm, or up to about 10 sccm), an optional noble gas (e.g., He or Ar) flow rate ranging up to about 2000 sccm (e.g., up to about 2000 sccm, or up to about 1000 sccm), a plasma source power ranging up to about 3000 W (watts) (e.g., up to about 2500 W, or ranging from about 1500 W to about 2500 W), and a lower electrode (e.g., element 522 in FIGS. 5-11) RF power level for electrically biasing the substrate ranging up to about 1000 W (e.g., up to about 500 W, or up to about 300 W, or up to 250 W). Also, the plasma source can operate at an RF or microwave frequency, e.g., 10 MHz to 5 GHz. In addition, the lower electrode bias frequency can range from about 0.1 MHz to about 200 MHz, e.g., about 2 MHz or 13.56 MHz.

As illustrated in FIG. 2D, following the performing of the one or more etching processes, the residual portion 270 of the spacer protection layer 260 may be selectively removed from the sidewall spacer 280. In one embodiment, the selective removal of the residual portion 270 of the spacer protection layer 260 is achieved by performing a wet cleaning process. For example, the wet cleaning process may include immersing the residual portion 270 of the spacer protection layer 260 in an HF solution, such as a dilute aqueous HF solution.

In one embodiment, the deposition process for forming the spacer protection layer 260, and the one or more etching processes are performed in the same plasma processing system. In an alternate embodiment, the deposition process for forming the spacer protection layer 260, and the one or more etching processes are performed in separate plasma processing systems.

In another embodiment, the deposition process for forming the spacer protection layer 260, and the one or more etching processes are repeated multiple cycles, e.g., two or more cycles until the low-k spacer material 250 is removed from the capping region 201 of the gate structure 200 and from the substrate region 202 on substrate 210 to leave behind the sidewall spacer 280.

In another embodiment, the one or more etching processes may include multiple process steps. In yet another embodiment, an over-etch process may be performed.

In one example, a spacer protection layer containing C and F was vapor deposited using a $C_4F_8$/Ar-based deposition chemistry on a low-k spacer material containing S, B, C, and N. The spacer sidewall was formed using a spacer etch process sequence that included a $CH_3F/O_2$/Ar-based etch chemistry. Measurements of the spacer sidewall composition using electron energy loss spectroscopy (EELS) confirmed that substantially no depletion of B and C occurred due to the presence of the spacer protection layer.

One or more of the methods for performing a spacer etch process sequence according to various embodiments described above may be performed in any one of the plasma processing systems illustrated in FIGS. 5 through 11 and described below.

Figure 5:
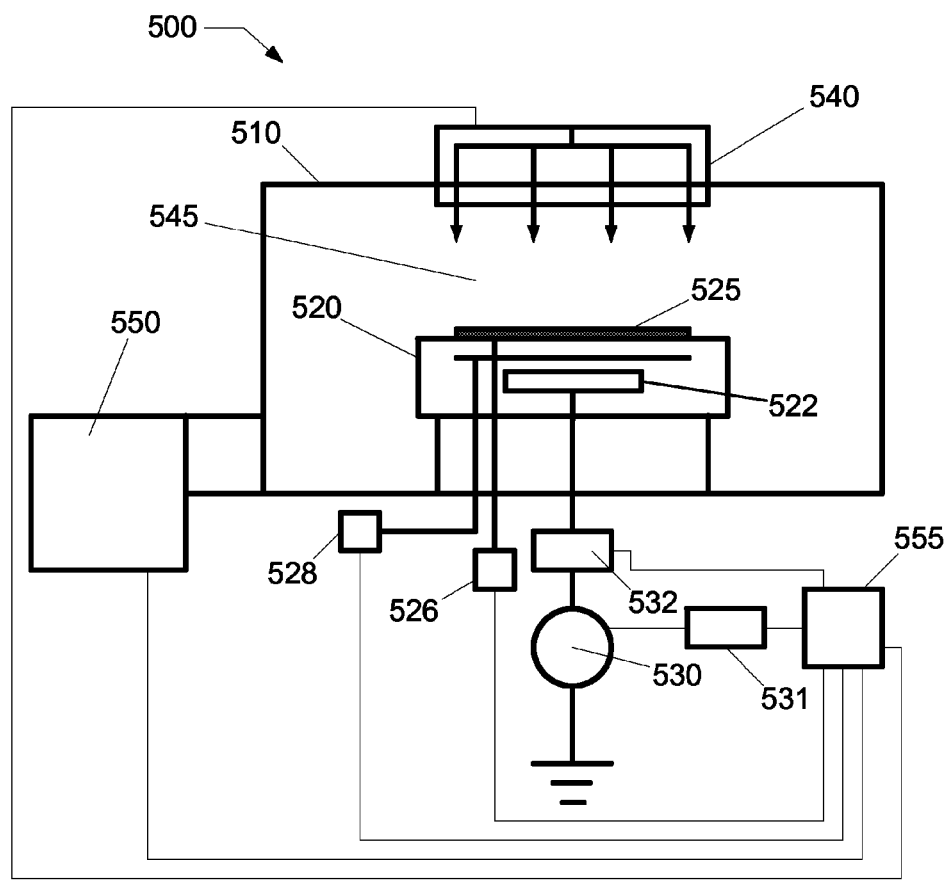
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a predetermined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic damping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
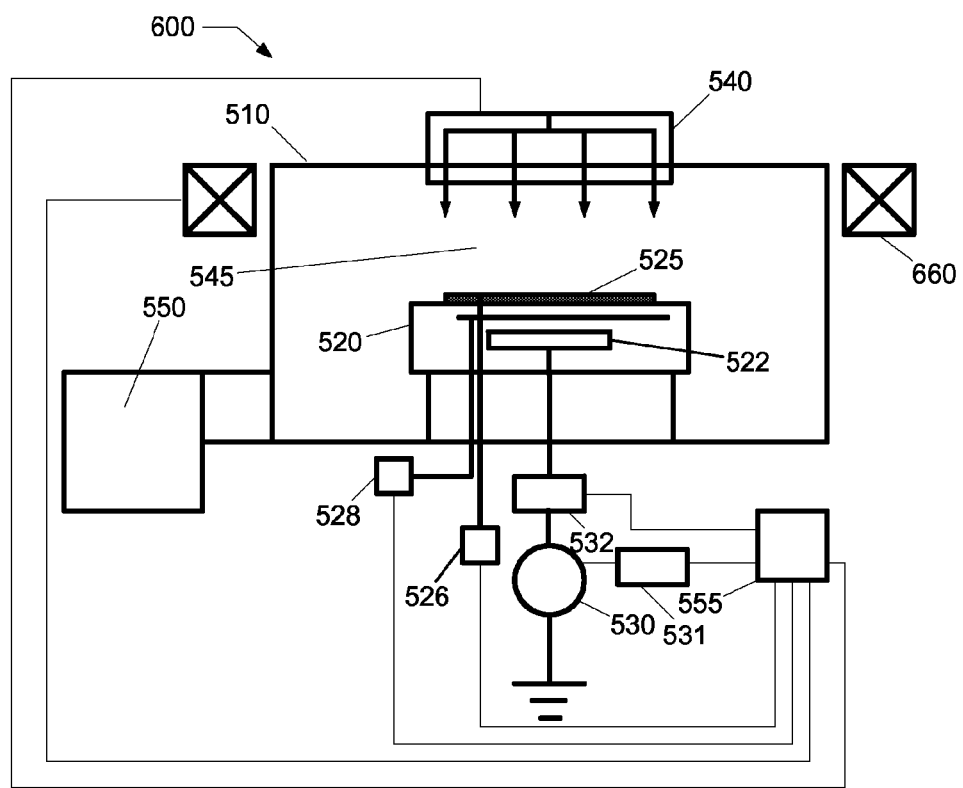
FIG. 6 shows a schematic representation of a plasma processing system according to another embodiment.
Figure 7:
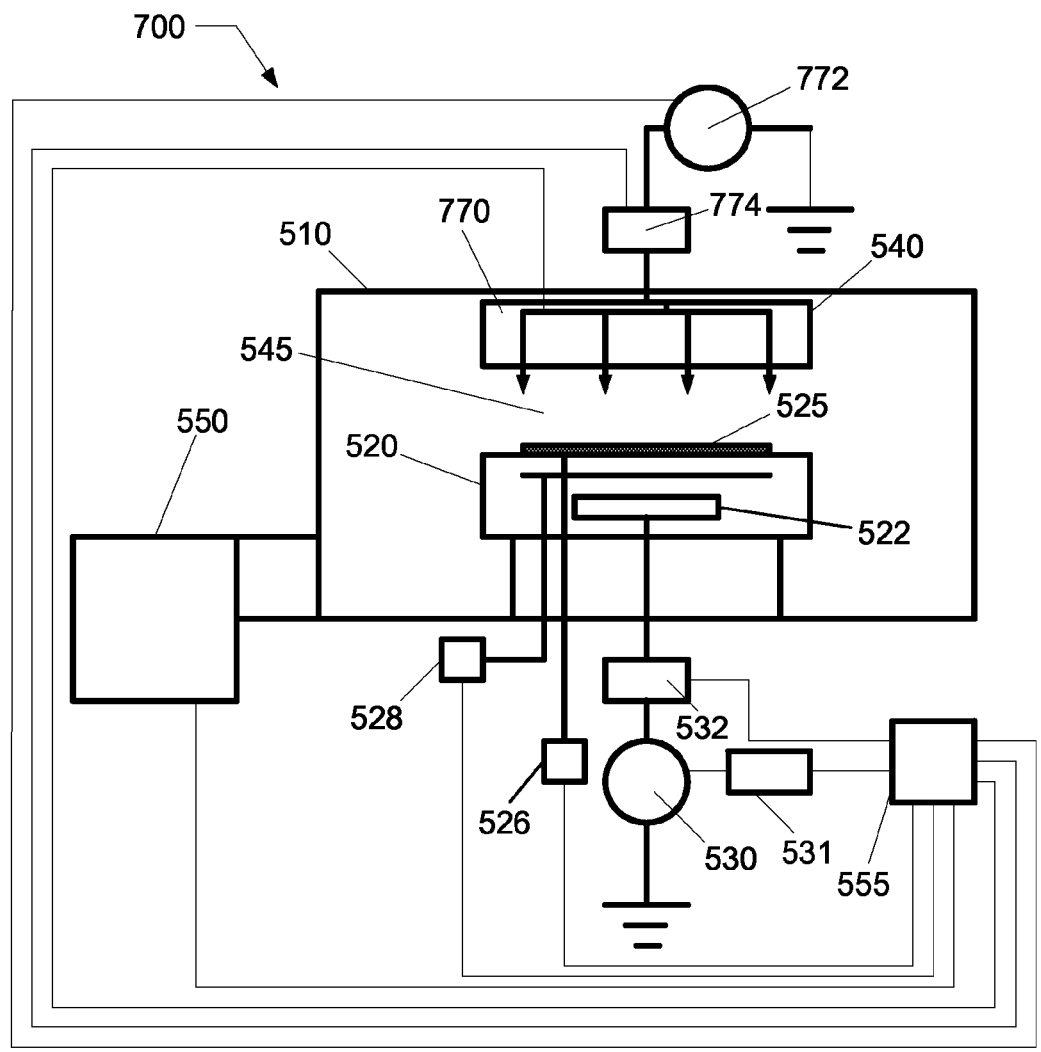
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
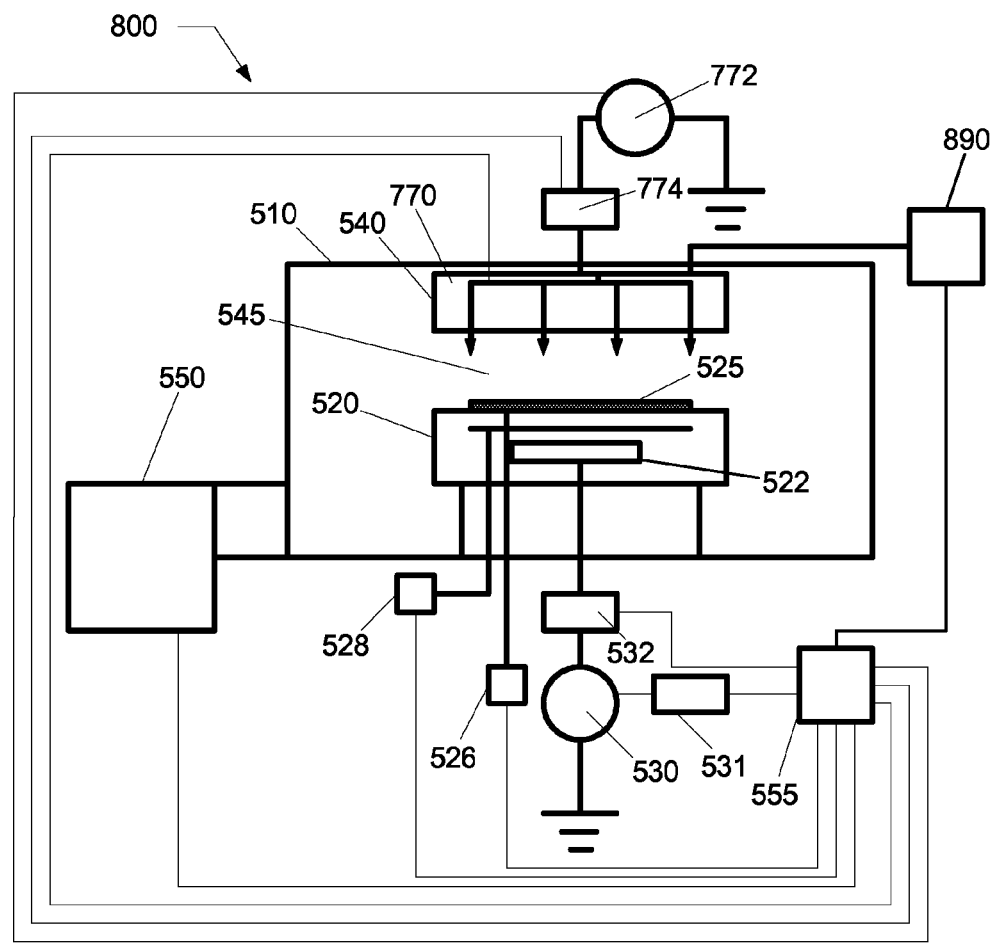
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
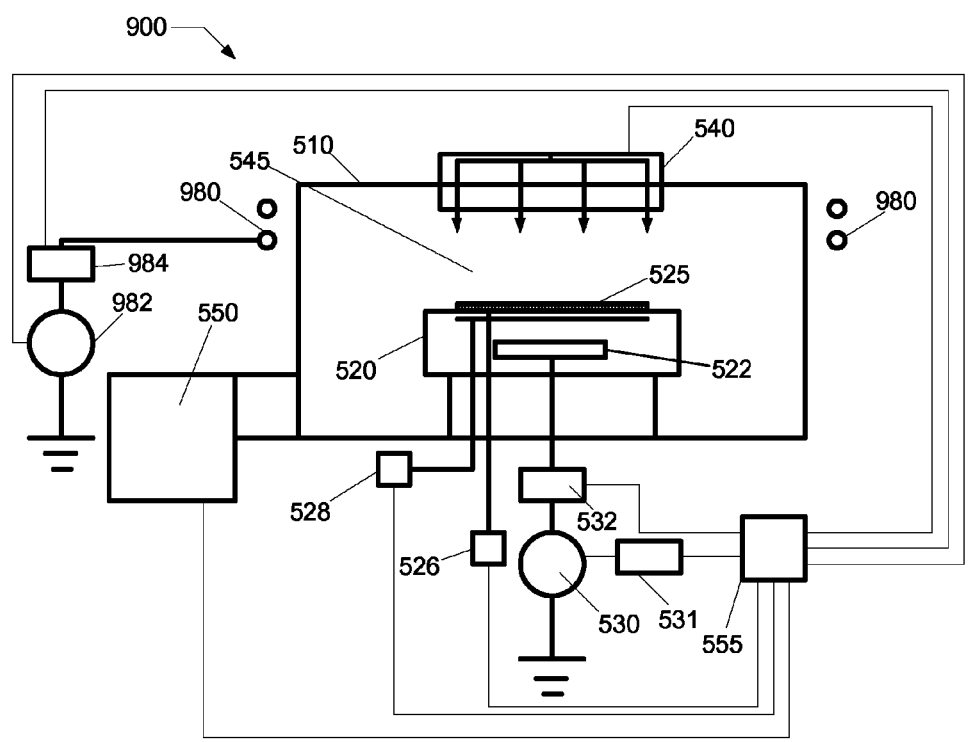
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
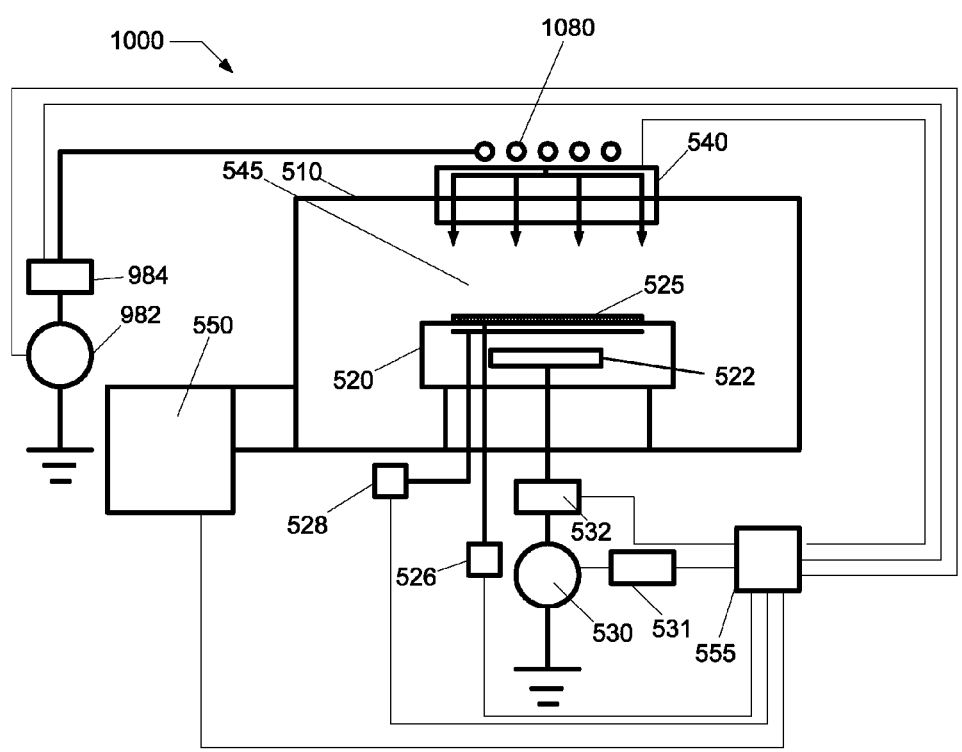
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
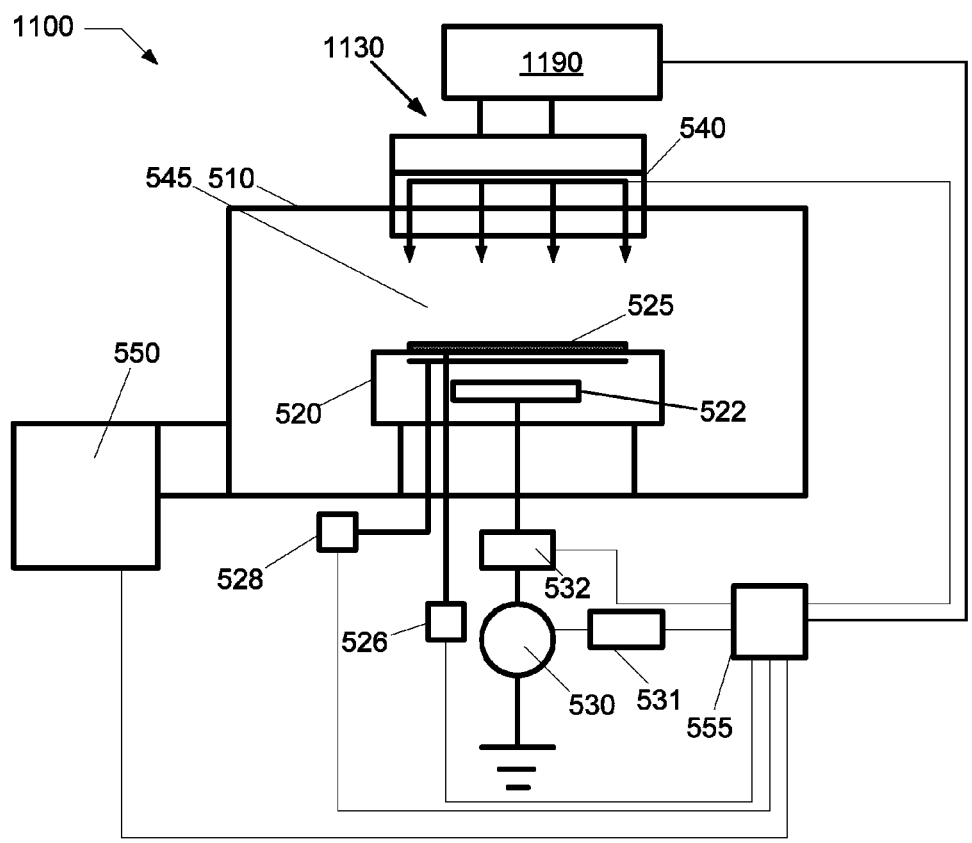
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for performing a spacer etch process, comprising:
providing a gate structure on a substrate having a low-k spacer material conformally applied over said gate structure, wherein said low-k spacer material contains Si, N, C, and B; and
performing a spacer etch process sequence to partially remove said low-k spacer material from said gate structure and said substrate, while retaining a sidewall spacer positioned along a sidewall of said gate structure, said spacer etch process sequence comprising:
depositing a spacer protection layer on an exposed surface of said low-k spacer material;
performing one or more etching processes to selectively and anisotropically remove said spacer protection layer and said low-k spacer material from a capping region of said gate structure and from a substrate region on said substrate adjacent a base of said gate structure to leave behind said sidewall spacer on said sidewall of said gate structure, wherein, while being partly or fully consumed by said one or more etching processes, said spacer protection layer limits exposure of said sidewall spacer to one or more chemical constituents in said one or more etching processes and reduces depletion of B or C in said sidewall spacer; and
repeating said depositing said spacer protection layer and said performing said one or more etching processes until said sidewall spacer remains as the only low-k spacer material on said gate structure.

2. The method of claim 1, wherein said low-k spacer material conformally applied over said gate structure has a thickness less than or equal to about 10 nanometers (nm).

3. The method of claim 1, wherein said spacer protection layer contains Si, O, and Cl.

4. The method of claim 1, wherein said forming said spacer protection layer comprises performing a vapor deposition process in an environment containing Si, Cl, and O.

5. The method of claim 4, wherein said forming said spacer protection layer comprises performing a plasma-assisted deposition process that includes generating plasma using a process composition containing as incipient ingredients SiCl4 and O2.

6. The method of claim 5, wherein said plasma-assisted deposition process excludes application of a radio frequency (RF) bias to a substrate holder upon which said substrate rests.

7. The method of claim 5, wherein a temperature of said substrate ranges from about 0 degrees C. to about 100 degrees C., and wherein said forming said spacer protection layer comprises adjusting at least one process parameter in said plasma-assisted deposition process to decrease a chemical permeability of said spacer protection layer.

8. The method of claim 1, wherein said forming said spacer protection layer comprises exposing said substrate to SiCl4 and H2O, and heating said substrate.

9. The method of claim 1, wherein said spacer protection layer contains C and at least one element selected from the group consisting of F and H, and wherein said forming said spacer protection layer comprises performing a vapor deposition process in an environment containing C and at least one element selected from the group consisting of F and H.

10. The method of claim 9, wherein said forming said spacer protection layer comprises performing a plasma-assisted deposition process that includes generating plasma using a film forming process composition containing as incipient ingredients a fluorocarbon gas expressed as CxHyFz, where x and z are non-zero; and
wherein said plasma-assisted deposition process excludes application of a radio frequency (RF) bias to a substrate holder upon which said substrate rests.

11. The method of claim 1, wherein said forming said spacer protection layer comprises performing a plasma-assisted deposition process that includes generating plasma using a film forming process composition containing as incipient ingredients a hydrocarbon gas expressed as CxHy, where x and y are non-zero.

12. The method of claim 10, wherein said forming said spacer protection layer comprises adjusting at least one process parameter in said vapor deposition process to decrease a chemical permeability of said spacer protection layer.

13. The method of claim 1, wherein said selectively and anisotropically removing said spacer protection layer and said spacer material comprises using a plasma etching process that includes generating plasma using an etching process composition containing as incipient ingredients a CxHyFz-containing gas, where x and z are non-zero, and a noble gas.

14. The method of claim 1, further comprising:
selectively removing any residual portion of said spacer protection layer from said sidewall of said gate structure.

15. The method of claim 1, wherein said forming said spacer protection layer comprises performing a vapor deposition process in an environment containing Si, Cl, and O, and wherein said spacer protection layer contains SiOCl.

16. The method of claim 15, further comprising:
selectively removing any residual portion of said spacer protection layer from said low-k spacer material.

17. The method of claim 16, wherein said forming said spacer protection layer comprises performing a plasma-assisted deposition process that includes generating plasma using a process composition containing as incipient ingredients SiCl4 and O2 or SiCl4 and H2O;
wherein said plasma-assisted deposition process excludes application of a radio frequency (RF) bias to a substrate holder upon which said substrate rests; and
wherein said selectively and anisotropically removing said spacer protection layer and said spacer material comprises using a plasma etching process that includes generating plasma using an etching process composition containing as incipient ingredients a $C_xH_yF_z$-containing gas, where x and z are non-zero, and a noble gas.

* * * * *